(12) United States Patent
Asano et al.

(10) Patent No.: US 10,495,989 B2
(45) Date of Patent: Dec. 3, 2019

(54) IMPRINT APPARATUS AND METHOD OF MANUFACTURING ARTICLE

(71) Applicant: CANON KABUSHIKI KAISHA, Tokyo (JP)

(72) Inventors: Tosiya Asano, Utsunomiya (JP); Takahiro Yoshida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 465 days.

(21) Appl. No.: 15/019,038

(22) Filed: Feb. 9, 2016

(65) Prior Publication Data

US 2016/0238954 A1     Aug. 18, 2016

(30) Foreign Application Priority Data

Feb. 12, 2015 (JP) ................................ 2015-025619
Sep. 16, 2015 (JP) ................................ 2015-183245

(51) Int. Cl.
| | |
|---|---|
| G03F 9/00 | (2006.01) |
| G03F 7/00 | (2006.01) |
| B29C 43/58 | (2006.01) |
| B29C 43/04 | (2006.01) |

(52) U.S. Cl.
CPC ............ *G03F 9/7034* (2013.01); *B29C 43/58* (2013.01); *G03F 7/0002* (2013.01); *B29C 43/04* (2013.01); *B29C 2043/5808* (2013.01); *B29C 2043/5833* (2013.01)

(58) Field of Classification Search
CPC .. G03F 9/7034; G03F 7/0002; G03F 7/70716; G03F 7/70725; G03F 9/7003; B29C 43/58; B29C 43/04; B29C 2043/5808; B29C 2043/5833
See application file for complete search history.

(56) References Cited

U.S. PATENT DOCUMENTS

| | | | |
|---|---|---|---|
| 7,658,601 B2 * | 2/2010 | Kasumi ................. | B82Y 10/00 101/3.1 |
| 7,880,872 B2 | 2/2011 | Nimmakayala et al. | |
| 8,562,323 B2 | 10/2013 | Ito et al. | |
| 8,763,239 B2 | 7/2014 | Lindner et al. | |
| 2005/0064054 A1 * | 3/2005 | Kasumi ................. | B82Y 10/00 425/112 |

(Continued)

FOREIGN PATENT DOCUMENTS

| | | |
|---|---|---|
| JP | 2007260791 A | 10/2007 |
| JP | 2008522412 A | 6/2008 |

(Continued)

*Primary Examiner* — Leith S Shafi
(74) *Attorney, Agent, or Firm* — Rossi, Kimms & McDowell LLP (57) ABSTRACT

The present invention provides an imprint apparatus which forms a pattern in an imprint material on a shot region of a substrate by using a mold, the apparatus comprising a stage that can move while holding the substrate, and a control unit configured to control relative positions of the mold and the shot region so as to reduce a shift in the relative positions caused by tilting the stage when bringing the mold and the imprint material into contact with each other, based on a contacting force of bringing the mold and the imprint material into contact with each other, and a distance from a reference position of the substrate to the shot region.

16 Claims, 6 Drawing Sheets

(56) References Cited

U.S. PATENT DOCUMENTS

2010/0270705 A1* 10/2010 Okushima .............. B82Y 10/00
                                                                                                264/293
2011/0133354 A1* 6/2011 Kimura .................. B82Y 10/00
                                                                                                264/40.5

FOREIGN PATENT DOCUMENTS

| | | |
|---|---|---|
| JP | 2009137286 A | 6/2009 |
| WO | 2007046820 A2 | 4/2007 |
| WO | 2011077584 A1 | 6/2011 |

* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus which forms a pattern in an imprint material supplied onto a substrate by using a mold has received attention as one of lithography apparatuses for mass-producing semiconductor devices, magnetic storage media, and the like. The imprint apparatus controls alignment between the mold and the substrate in a state in which the mold and the imprint material are in contact with each other in order to overlay a pattern region of the mold and a shot region of the substrate (refer to Japanese Patent Laid-Open No. 2008-522412). The alignment can be controlled, based on, for example, detection results of marks provided in the pattern region and the shot region, respectively, such that the relative positions of the mold and the substrate fall within the allowable range of target relative positions.

The imprint apparatus cures the imprint material in the state in which the mold and the imprint material are in contact with each other after completion of alignment between the mold and the substrate. Then, the pattern is formed in the imprint material on the substrate by separating the mold from the cured imprint material.

When the imprint apparatus brings the mold and the imprint material on the shot region into contact with each other, a stage which holds the substrate may tilt by a force of bringing the mold and the imprint material into contact with each other, and the relative positions of the mold and the shot region may shift. In this case, it may take a considerable time to restore the shifted relative positions of the mold and the shot region because the relative positions of the mold and the shot region fluctuate slowly due to the viscosity of the imprint material even if the tilt of the stage is restored.

Additionally, when the imprint apparatus separates the mold from the cured imprint material, the stage may tilt by a force (separating force) of separating the mold from the imprint material and the relative positions of the mold and the substrate may shift. In this case, a pattern of the mold and the pattern formed in the imprint material may be damaged.

SUMMARY OF THE INVENTION

The present invention provides, for example, an imprint apparatus advantageous in reducing a shift in the relative positions of a mold and a substrate caused by the tilt of a stage which holds the substrate.

According to one aspect of the present invention, there is provided an imprint apparatus which forms a pattern in an imprint material on a shot region of a substrate by using a mold, the apparatus comprising: a stage that can move while holding the substrate; and a control unit configured to control relative positions of the mold and the shot region so as to reduce a shift in the relative positions caused by tilting the stage when bringing the mold and the imprint material into contact with each other, based on a contacting force of bringing the mold and the imprint material into contact with each other, and a distance from a reference position of the substrate to the shot region.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described. The imprint apparatus 100 is used to manufacture a semiconductor device or the like and performs an imprint process of forming a pattern in an imprint material 11 on a shot region of a substrate 3 by using a mold 6. For example, the imprint apparatus 100 cures the imprint material 11 (resin) in a state in which the mold 6 and the imprint material 11 on the shot region are in contact with each other. Then, the imprint apparatus 100 can form the pattern made of the imprint material 11 on the shot region by widening the spacing between the mold 6 and the substrate 3, and separating (releasing) the mold 6 from the cured imprint material 11. A method of curing the imprint material 11 includes a heat cycle method using heat and a photo-curing method using light. In the first embodiment, an example of adopting the photo-curing method will be described. The photo-curing method is a method of curing the imprint material 11 by supplying an uncured ultraviolet-curing resin as the imprint material 11 onto the shot region, and irradiating the imprint material 11 with ultraviolet rays in the state in which the mold 6 and the imprint material 11 are in contact with each other.

[Apparatus Configuration]

Figure 1:
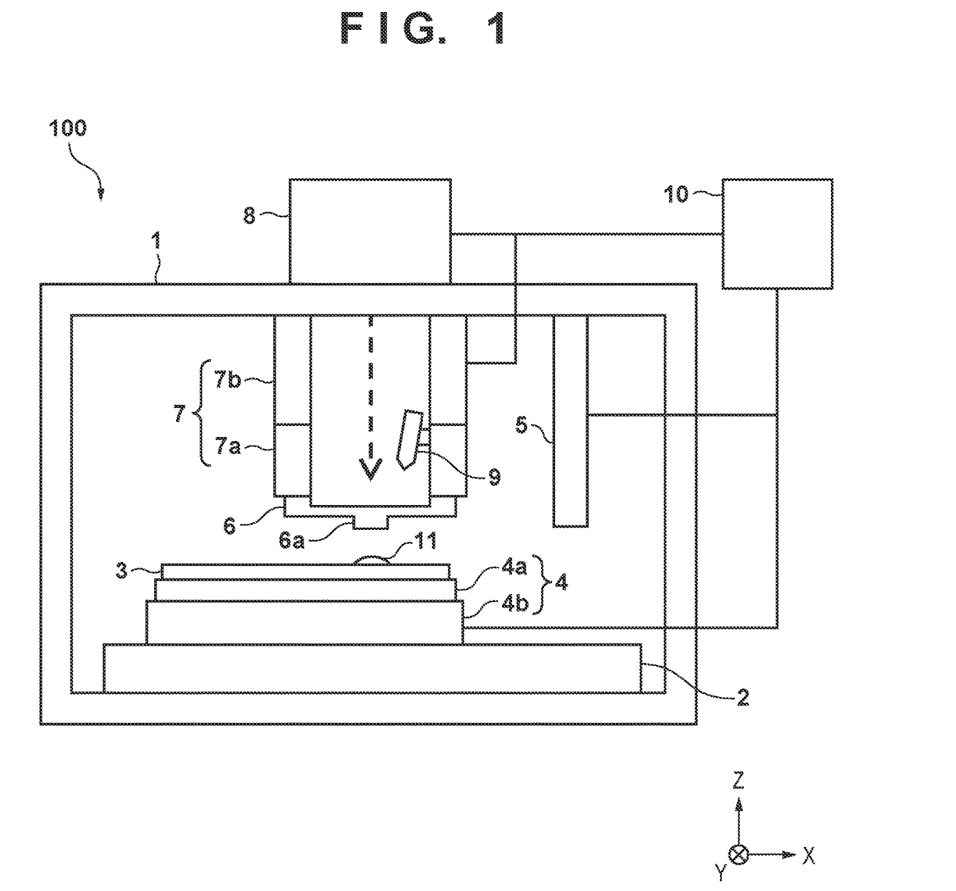
FIG. 1 is a schematic view showing an imprint apparatus according to the first embodiment.

FIG. 1 is a schematic view showing the imprint apparatus 100 according to the first embodiment. The imprint apparatus 100 can include an imprint head 7, a substrate stage 4, a curing unit 8, a supply unit 5, a measurement unit 9, and a control unit 10. A structure 1 supports the imprint head 7, the curing unit 8, the supply unit 5, and the measurement unit 9. The substrate stage 4 is configured to be movable on a surface plate 2. The control unit 10 includes, for example, a CPU and a memory, and controls the imprint process (controls the respective units of the imprint apparatus 100).

The mold 6 is generally made of a material such as quartz capable of transmitting ultraviolet rays. A three-dimensional pattern for molding the imprint material 11 on the substrate is formed in a partial region (pattern region 6a) on a substrate-side surface. The substrate 3 is, for example, a single-crystal silicon substrate or a glass substrate. The supply unit 5 supplies the imprint material 11 onto the upper surface (surface to be processed) of the substrate 3.

In the imprint process, the curing unit 8 irradiates the imprint material 11 on the shot region with light (ultraviolet rays) which cures the imprint material 11 through the mold 6 and cures the imprint material 11. The curing unit 8 can include, for example, a light source which emits light to cure the imprint material 11 and an optical element for adjusting light emitted from the light source to light suitable for the imprint process. The light source which emits the ultraviolet rays is provided in the curing unit 8 because the photo-curing method is adopted in the first embodiment. However, when adopting, for example, the heat cycle method, a heat source for setting a thermosetting resin serving as the imprint material 11 can be provided instead of the light source.

The measurement unit 9 detects the positional shift between an alignment mark provided for the pattern region 6a of the mold 6 and an alignment mark provided for the shot region of the substrate 3, and measures the relative positions of the pattern region 6a and the shot region. The supply unit 5 supplies (applies) the imprint material 11 (uncured resin) onto the shot region of the substrate 3. In the imprint apparatus 100 according to the first embodiment, the supply unit 5 supplies, as the imprint material 11, an ultraviolet-curing resin having the property of curing by ultraviolet irradiation onto the shot region.

The imprint head 7 can include, for example, a mold holding unit 7a which holds the mold 6 by a vacuum suction force, an electrostatic force, or the like and a mold driving unit 7b which drives the mold holding unit 7a in a Z direction. Each of the mold holding unit 7a and the mold driving unit 7b has an opening region in its central portion (interior), and is configured so that light from the curing unit 8 passes through the opening region and irradiates the imprint material 11 on the substrate through the mold 6. The imprint head 7 may have not only a function of driving the mold 6 in the Z direction but also an adjustment function of adjusting the position of the mold 6 in X and Y directions and a θ direction (a rotation direction about a Z-axis), a tilt function of correcting the tilt of the mold 6, and the like.

The substrate stage 4 includes, for example, a substrate chuck 4a which holds the substrate 3 by the vacuum suction force, the electrostatic force, or the like and a substrate driving unit 4b configured to be movable on the surface plate 2 while mechanically holding the substrate chuck 4a, and positions the substrate 3 in the X and Y directions. The substrate stage 4 may have not only a function of driving the substrate 3 in the X and Y directions but also an adjustment function of adjusting the position of the substrate 3 in the Z direction and the θ direction, a tilt function of correcting the tilt of the substrate 3, and the like. In the imprint apparatus 100 according to the first embodiment, the substrate stage 4 performs an operation of changing the relative positions of the mold 6 and the substrate 3 in the X and Y directions. However, the present invention is not limited to this. The imprint head 7 may perform that operation or both of the substrate stage 4 and the imprint head 7 may relatively perform that operation. Furthermore, in the imprint apparatus 100 according to the first embodiment, the imprint head 7 performs an operation of changing the distance (Z direction) between the mold 6 and the substrate 3. However, the present invention is not limited to this. The substrate stage 4 may perform that operation or both of the imprint head 7 and the substrate stage 4 may relatively perform that operation. That is, at least one of the mold driving unit 7b and the substrate driving unit 4b may be used as a driving unit which drives at least one of the mold 6 and the substrate 3 so as to bring the mold 6 and the imprint material 11 into contact with each other.

Figure 2A:
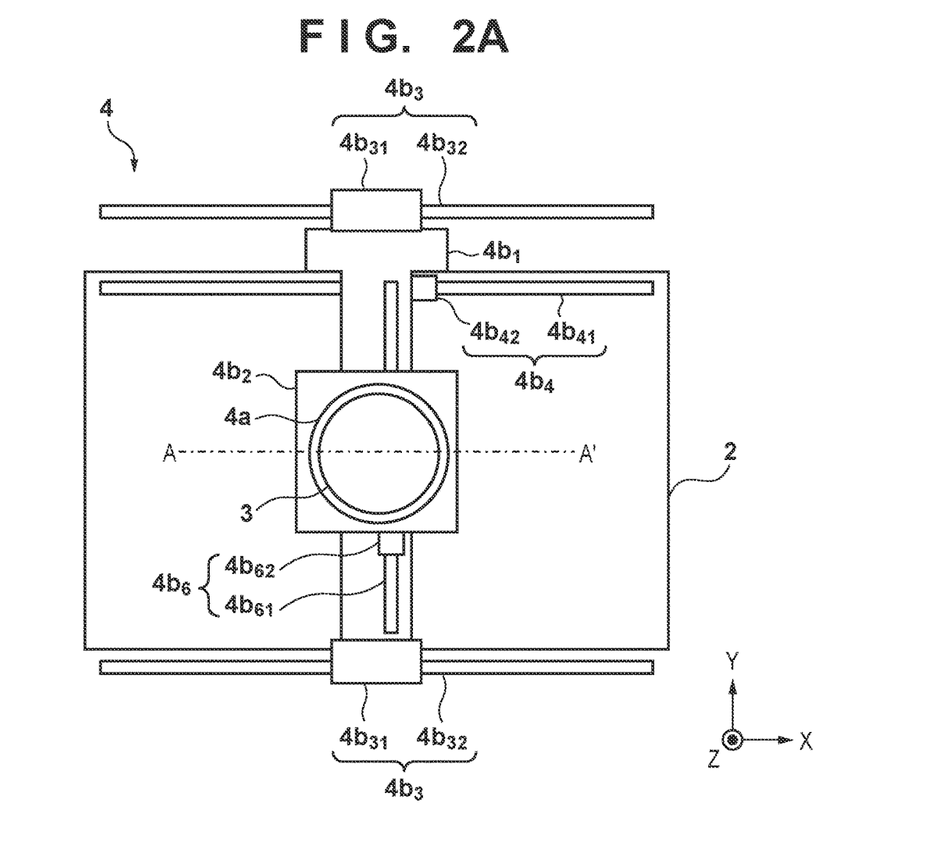
FIG. 2A is a view showing an example of the arrangement of a substrate stage.
Figure 2B:
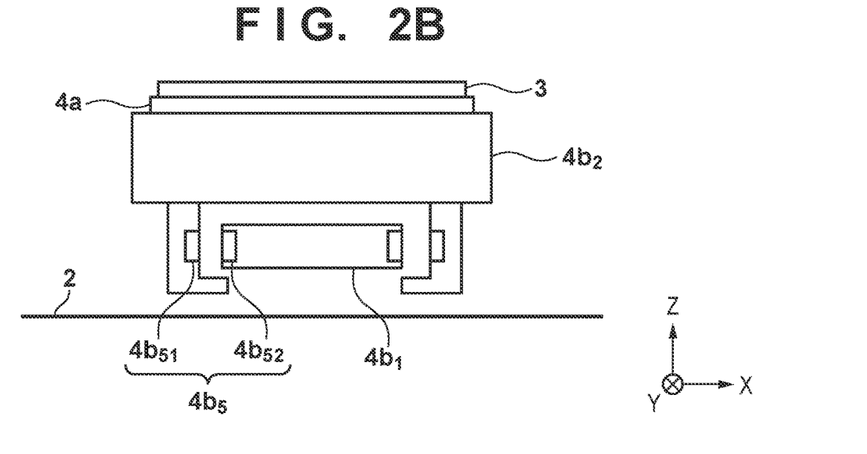
FIG. 2B is a view showing an example of the arrangement of the substrate stage.

An example of the arrangement of the substrate stage 4 will now be described with reference to FIGS. 2A and 2B. Each of FIGS. 2A and 2B is a view showing the example of the arrangement of the substrate stage 4. FIG. 2A is the view showing the substrate stage 4 when viewed from the Z direction. FIG. 2B is the sectional view taken along A-A' in FIG. 2A. The substrate driving unit 4b of the substrate stage 4 can include, for example, an X stage $4b_1$ (first stage) and a Y stage $4b_2$ (second stage). The X stage $4b_1$ is configured to be movable on the surface plate 2 in the first direction (for example, the X direction). On the other hand, the Y stage $4b_2$ supports the substrate chuck 4a and configured, by a static pressure guide (not shown), to be movable on the X stage $4b_1$ in the second direction (for example, the Y direction) different from the first direction. The thus configured substrate driving unit 4b can move the Y stage $4b_2$ and the substrate chuck 4a (substrate 3) in the X direction by driving the X stage $4b_1$ in the X direction. The substrate driving unit 4b can also move the substrate chuck 4a (substrate 3) in the Y direction by driving the Y stage $4b_2$ in the Y direction. That is, the substrate driving unit 4b can move the substrate 3 in the X and Y directions by driving the X stage $4b_1$ in the X direction and driving the Y stage $4b_2$ in the Y direction.

The X stage $4b_1$ is positioned by the static pressure guide so as to generate a gap by a predetermined amount with respect to the surface plate 2 and is driven by a first driving unit $4b_3$ on the surface plate 2 in the X direction. The first driving unit $4b_3$ can include, for example, a linear motor which includes a movable element $4b_{31}$ including a permanent magnet and a stator $4b_{32}$ including a plurality of coils arrayed in the X direction. The first driving unit $4b_3$ can drive the X stage $4b_1$ in the X direction by controlling current to be supplied to the plurality of coils in the stator $4b_{32}$ to move the movable element $4b_{31}$ along the stator $4b_{32}$. A first detection unit $4b_4$ constituted by, for example, an encoder or an interferometer can detect the position of the X stage $4b_1$ in the X direction. In the example shown in FIGS. 2A and 2B, an encoder including a scale $4b_{41}$ and a head $4b_{42}$ which obtains the position of the X stage $4b_1$ in the X direction by light from the scale $4b_{41}$ is provided as the first detection unit $4b_4$.

On the other hand, the Y stage $4b_2$ is positioned by the static pressure guide so as to generate a gap by a predetermined amount with respect to the X stage $4b_1$ and is driven by a second driving unit $4b_5$ on the X stage $4b_1$ in the Y direction. As shown in FIG. 2B, the second driving unit $4b_5$ can include, for example, a linear motor which includes a movable element $4b_{51}$ including a permanent magnet and a stator $4b_{52}$ including a plurality of coils arrayed in the Y direction. The second driving unit $4b_5$ can drive the Y stage $4b_2$ in the Y direction by controlling current to be supplied to the plurality of coils in the stator $4b_{52}$ to move the movable element $4b_{51}$ along the stator $4b_{52}$. A second detection unit $4b_6$ constituted by, for example, an encoder or an interferometer can detect the position of the Y stage $4b_2$ in the Y direction. In the example shown in FIGS. 2A and 2B, an encoder including a scale $4b_{61}$ and a head $4b_{62}$ which obtains the position of the Y stage $4b_2$ in the Y direction by light from the scale $4b_{61}$ is provided as the second detection unit $4b_6$.

[Imprint Process for Each Shot Region]

Figure 3:
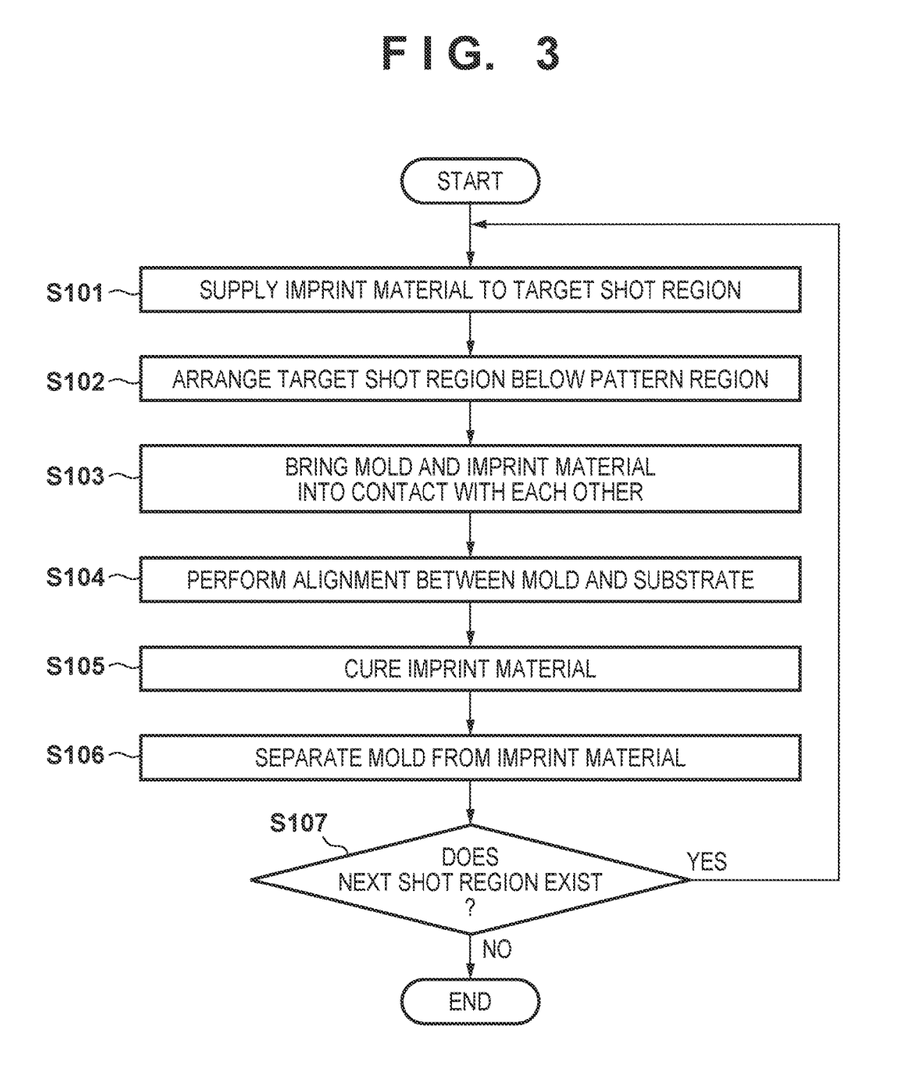
FIG. 3 is a flowchart showing an operation sequence of performing an imprint process on each of a plurality of shot regions.

An operation sequence of performing the imprint process on each of the plurality of shot regions on the substrate 3 will now be described with reference to FIG. 3. FIG. 3 is a flowchart showing the operation sequence of performing the imprint process on each of the plurality of shot regions.

In step S101, the control unit 10 controls the substrate stage 4 to arrange the shot region targeted for performing the imprint process (to be referred to as a target shot region 3a hereinafter) under the supply unit 5 and controls the supply unit 5 to supply the imprint material 11 to the target shot region 3a. The supply unit 5 may supply the imprint material 11 to the target shot region 3a without changing the positional relationship between the target shot region 3a and the supply unit 5 or while relatively scanning the target shot region 3a and the supply unit 5. In step S102, the control unit 10 controls the substrate stage 4 to arrange the target shot region 3a below the pattern region 6a of the mold 6. In step S103, the control unit 10 controls the imprint head 7 to narrow the spacing between the mold 6 and the substrate 3, thereby bringing the mold 6 and the imprint material 11 on the target shot region 3a into contact with each other. Then, the control unit 10 generates a force (contacting force) of bringing the mold 6 and the imprint material 11 into contact with each other in the mold driving unit 7b of the imprint head 7 so as to fill in every corner of the pattern of the mold 6 with the imprint material 11. The force of bringing the mold 6 and the imprint material 11 into contact with each other is, for example, a force of pressing the mold 6 against the imprint material 11 and will be referred to as a pressing force hereinafter. The control unit 10 releases the pressing force in the mold driving unit 7b after a lapse of a predetermined time in a state in which the pressing force is generated in the mold driving unit 7b. The pressing force at this time may not completely be zero but may remain slightly.

In step S104, the control unit 10 performs alignment between the mold 6 and the substrate 3 based on a measurement result by the measurement unit 9. For example, the control unit 10 causes the measurement unit 9 to detect the positional shift between the alignment marks that have been formed in the pattern region 6a and the target shot region 3a, respectively. The control unit 10 causes the measurement unit 9 to measure the relative positions of the pattern region 6a and the target shot region 3a based on detection results of the respective alignment marks. Then, the control unit 10 performs, based on the measurement result by the measurement unit 9, feedback control of the relative positions of the mold 6 and the substrate 3 such that the deviation between target relative positions and the relative positions measured by the measurement unit 9 falls within an allowable range.

In step S105, the control unit 10 controls the curing unit 8 to irradiate the imprint material 11 in contact with the mold 6 with light (ultraviolet rays), thereby curing the imprint material 11. In step S106, the control unit 10 controls the imprint head 7 to widen the spacing between the mold 6 and the substrate 3, thereby separating (releasing) the mold 6 from the cured imprint material 11. In step S107, the control unit 10 determines whether there is the shot region (next shot region) to which the pattern of the mold 6 is to be transferred onto the substrate continuously. If there is the next shot region, the process advances to step S101. If there is not the next shot region, the process ends.

[Shift in Relative Positions of Mold and Target Shot Region]

Figure 4A:
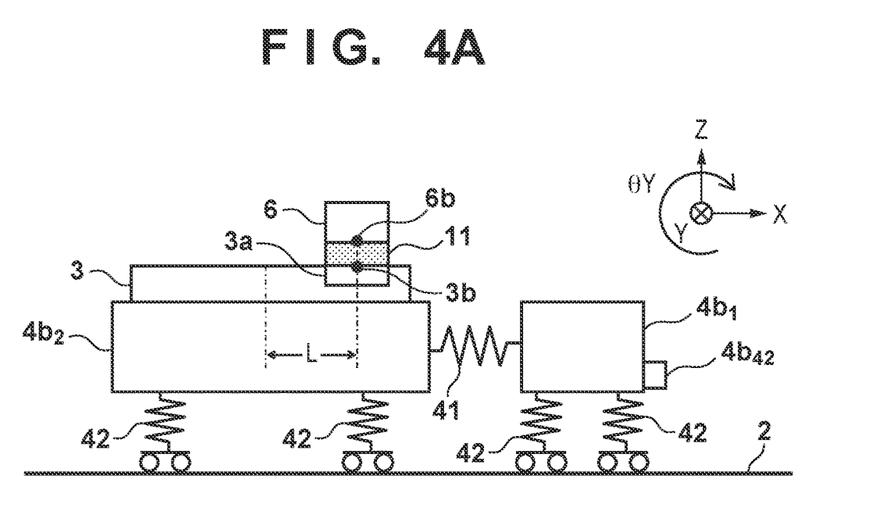
FIG. 4A is a conceptual view of the substrate stage for explaining the behavior of the substrate stage in a step of bringing a mold and an imprint material into contact with each other.
Figure 4B:
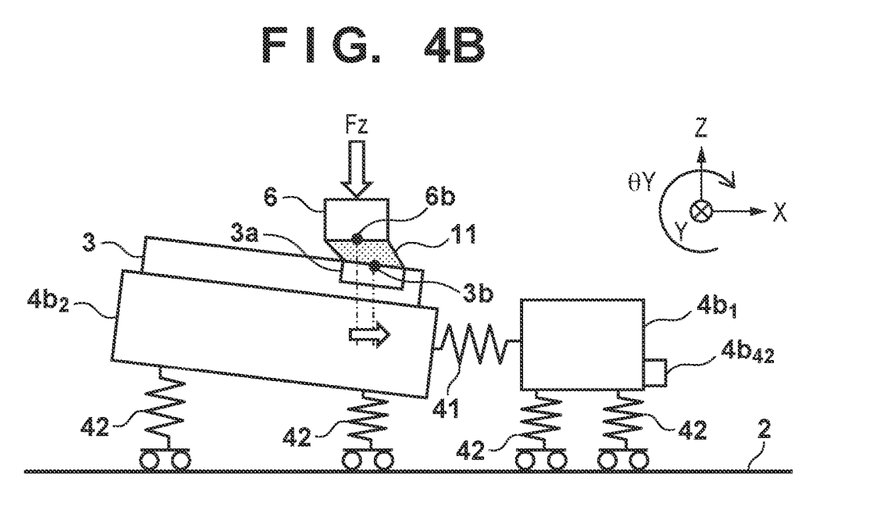
FIG. 4B is a conceptual view of the substrate stage for explaining the behavior of the substrate stage in the step of bringing the mold and the imprint material into contact with each other.
Figure 5:
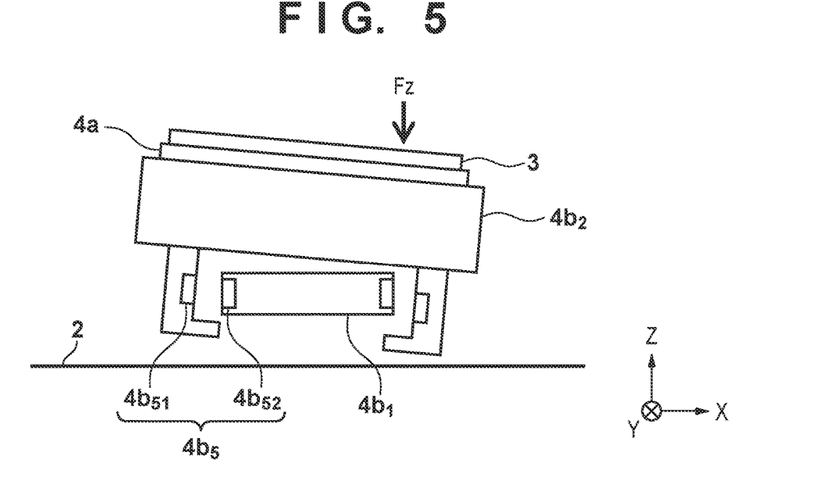
FIG. 5 is a sectional view showing the substrate stage in the step of bringing the mold and the imprint material into contact with each other.

In the imprint apparatus, the relative positions (X and Y directions) of the mold 6 and the target shot region 3a may shift when the substrate stage 4 (Y stage $4b_2$) tilts by the pressing force in a step (step S103) of bringing the mold 6 and the imprint material 11 into contact with each other. The behavior of the substrate stage 4 when bringing the mold 6 and the imprint material 11 into contact with each other will now be described with reference to FIGS. 4A and 4B, and FIG. 5. Each of FIGS. 4A and 4B is a conceptual view of the substrate stage 4 for explaining the behavior of the substrate stage 4 in the step of bringing the mold 6 and the imprint material 11 into contact with each other. In the conceptual view of the substrate stage 4 shown in each of FIGS. 4A and 4B, each static pressure guide is represented by a spring symbol for the sake of simplicity, and the X stage $4b_1$ and the Y stage $4b_2$ which are arranged horizontally via a static pressure guide 41 represented by the spring symbol are shown. Each static pressure guide 42 on the surface plate 2 is represented by the spring symbol and wheels, has a spring characteristic only in the Z direction, and can move freely in the X and Y directions. FIG. 5 is a sectional view (a sectional view taken along A-A' in FIG. 2A) of the substrate stage 4 in the step of bringing the mold 6 and the imprint material 11 into contact with each other.

For example, the target shot region 3a is arranged away from the reference position (for example, the center) of the substrate 3 by a distance L in a +X direction, as shown in FIG. 4A. In FIG. 4A, assume that there is no initial positional shift between a mark 3b of the target shot region 3a and a mark 6b of the mold 6 in the x direction, for the sake of clarity. In this case, if a pressing force Fz (a force which brings the mold 6 and the imprint material 11 into contact with each other) is applied from a state shown in FIG. 4A, the Y stage $4b_2$ tilts in a θY direction by the pressing force Fz, as shown in FIG. 4B and FIG. 5. As a result, the mark 3b of the target shot region 3a and the mark 6b of the mold 6 can relatively shift in the X direction even if feedback control of the position of the X stage $4b_1$ in the X direction is performed based on the result of the detection by the first detection unit $4b_4$. That is, the relative positions of the mold 6 and the target shot region 3a in the X direction may shift. The imprint material 11 before being cured in this state has a viscoelasticity characteristic with both characteristics of a spring characteristic and a viscosity, and a shearing force can be generated there. For this reason, a force (the reaction force of the shearing force) in a −X direction from the imprint material 11 acts on the target shot region 3a (substrate 3) due to the spring characteristic of the imprint material 11. That is, a force of shifting the relative positions of the mold 6 and the substrate 3 acts on them. However, the static pressure guide 41 is being stretched because the position of the X stage $4b_1$ is controlled by the detection result of the first detection unit $4b_4$, as described above.

Therefore, even if the pressing force Fz is released to restore the tilt of the Y stage $4b_2$, the shearing force may change due to the viscosity of the imprint material 11, and the relative positions of the mold 6 and the target shot region 3a may fluctuate slowly. Therefore, it may take a considerable time to settle the relative positions of the mold 6 and the target shot region 3a.

To cope with this, the imprint apparatus 100 according to the first embodiment controls the relative positions of the mold 6 and the target shot region 3a so as to reduce a shift in the relative positions (X and Y directions) of the mold 6 and the target shot region 3a when bringing the mold 6 and the imprint material 11 into contact with each other. The relative positions of the mold 6 and the target shot region 3a can be controlled based on the pressing force Fz and the distance L from the reference position of the substrate 3 to the target shot region 3a. Furthermore, the relative positions may be controlled while the mold 6 and the imprint material 11 are in contact with each other by applying the pressing force Fz to the mold driving unit, that is, while the pattern of the mold 6 is filled with the imprint material 11. The imprint apparatus 100 can bring the mold 6 and the imprint material 11 into contact with each other so as to increase a contact area gradually or to fill the pattern concave portion of the mold 6 with the imprint material 11 gradually. The reference position can be a position on the substrate where the tilt of the substrate stage 4 becomes smallest when bringing the mold 6 into contact with the imprint material 11. The reference position can be set, for example, in the barycenter of the substrate 3. The reference position may also be set in the center of the substrate 3.

[Control of Relative Positions of Mold and Target Shot Region]

Figure 6:
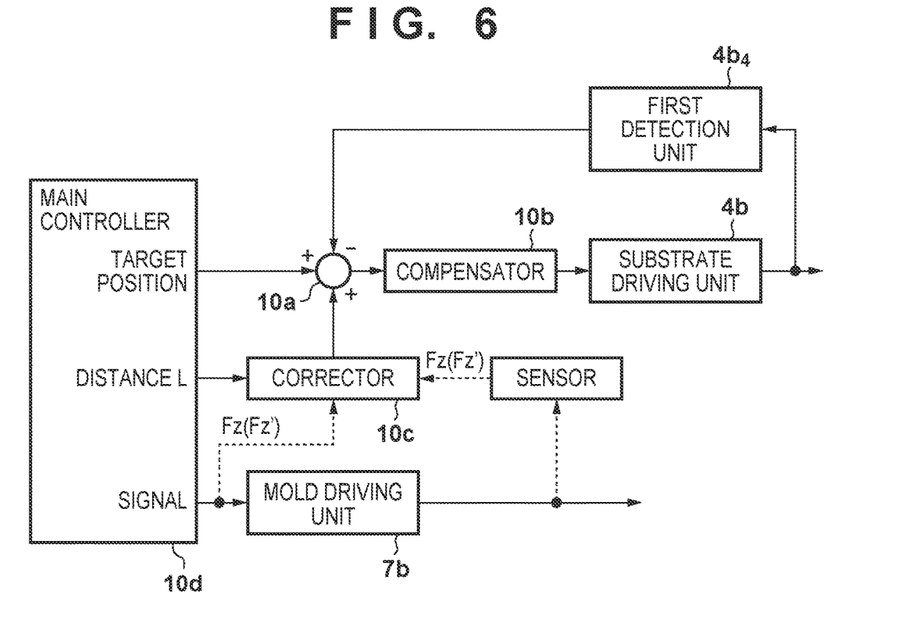
FIG. 6 is a block diagram for explaining control of the relative positions of the mold and a target shot region in the imprint apparatus according to the first embodiment.

Control of the relative positions of the mold 6 and the target shot region 3a in the X direction in the imprint apparatus 100 according to the first embodiment will now be described with reference to FIG. 6. FIG. 6 is a block diagram for explaining control of the relative positions of the mold 6 and the target shot region 3a in the imprint apparatus 100 according to the first embodiment. The control unit 10 includes a subtracter 10a, a compensator 10b, a corrector 10c, and a main controller 10d in FIG. 6.

In step S103, the subtracter 10a obtains the deviation between the position of the X stage $4b_1$ detected by the first detection unit $4b_4$ and the target position of the X stage $4b_1$ supplied from the main controller 10d. The compensator 10b determines a command value for driving the X stage $4b_1$ and supplies the determined command value to the first driving unit $4b_3$ such that the deviation supplied from the subtracter 10a falls within an allowable range. The first driving unit $4b_3$ includes, for example, a current driver which supplies the current to the coils included in the stator $4b_{32}$, supplies the current to the coils of the stator $4b_{32}$ in accordance with the command value supplied from the compensator 10b, and generates a thrust for driving the X stage $4b_1$ in the X direction. The control unit 10 thus performs feedback control of the position of the substrate stage 4 (X stage $4b_1$) in the X direction. That is, the control unit 10 performs feedback control for keeping the deviation between the target relative positions and the relative positions of the mold 6 and the substrate 3 within the allowable range. That is, the imprint apparatus 100 can reduce a relative positional shift (positional shift) in a direction (for example, a horizontal direction) intersecting a direction in which the pressing force is applied by moving the pattern of the mold 6 and the target shot region formed on the substrate 3 relatively within the X-Y plane.

Also in step S103 described above, the main controller 10d supplies a signal (for example a current) for bringing the mold 6 and the imprint material 11 into contact with each other to the mold driving unit 7b (imprint head 7), thereby bringing the mold 6 and the imprint material 11 into contact with each other. Then, the main controller 10d supplies a signal for generating the pressing force Fz in the imprint head 7 to the mold driving unit 7b while gradually bringing the mold 6 and the imprint material 11 into contact with each other.

The control unit 10 corrects, by the corrector 10c, the relative positional shift caused by tilting the substrate stage 4. The corrector 10c obtains the relative positional shift caused by tilting the substrate stage 4 (Y stage $4b_2$) when bringing the mold 6 and the imprint material 11 into contact with each other, and supplies a correction value for correcting the relative positional shift to the subtracter 10a. More specifically, the X stage $4b_1$ is moved in the –X direction for correction. With this movement, the shift in the relative positions of the mold 6 and the substrate 3 in the X direction (horizontal direction) is reduced though the tilt of the Y stage $4b_2$ is unchanged. This makes it possible to reduce the shearing force which acts on the imprint material 11.

The relative positional shift is in proportional to, for example, the pressing force Fz and the distance L from the reference position of the substrate 3 to the target shot region 3a. Therefore, the corrector 10c may obtain, based on information (a formula or a table) indicating the relationship of the shift in the relative positions (horizontal direction) with respect to the pressing force Fz and the distance L, the pressing force Fz and the shift in the relative positions (correction value) from the distance L. The information can be acquired in advance by a simulation, an experiment, or the like. The subtracter 10a adds the thus obtained correction value to the deviation between the target position and the current position of the X stage $4b_1$. The compensator 10b determines, based on value obtained by adding the correction value to the deviation, the command value for driving the X stage $4b_1$. That is, in step S103, feed-forward control for correcting the relative positional shift caused by tilting the substrate stage 4 is sequentially performed in parallel with feedback control based on the result of the detection by the first detection unit $4b_4$.

The pressing force Fz can be obtained by, for example, multiplying a signal value to be supplied to the mold driving unit 7b by a constant (thrust constant) indicating a force generated by the mold driving unit 7b when supplying the signal value of a unit quantity. Also, a sensor (for example, a force sensor, a load cell, or a strain gauge) which detects the force generated by the mold driving unit 7b may be provided to obtain the pressing force Fz based on a result of a detection by the sensor. In the imprint apparatus 100 according to the first embodiment, the relative positional shift is corrected by moving the substrate stage 4 (X stage $4b_1$) in the horizontal direction. However, the present invention is not limited to this. The relative positional shift may be corrected by, for example, moving the imprint head 7 in the horizontal direction.

As described above, the imprint apparatus 100 according to the first embodiment controls the relative positions of the mold 6 and the target shot region 3a based on the pressing force Fz and the distance L in the step of bringing the mold 6 and the imprint material 11 into contact with each other. This makes it possible to reduce the shearing force generated when bringing the mold 6 and the imprint material 11 into contact with each other. That is, it is possible to reduce the shift in the relative positions of the mold 6 and the target shot region 3a caused by tilting the substrate stage 4 when bringing the mold 6 and the imprint material 11 into contact with each other. That is, since fluctuations in the relative positions of the mold 6 and the target shot region 3a that occur when releasing the pressing force Fz can be reduced, it is possible to shorten a time required to settle the relative positions of the mold and the shot region, and to increase throughput.

Second Embodiment

In a step (step S106) of separating (releasing) a mold 6 from a cured imprint material 11, an imprint apparatus 100 causes a mold driving unit 7b of an imprint head 7 to generate a force (separating force) of separating the mold 6 from the cured imprint material 11. Therefore, also in step S106, a substrate stage 4 (Y stage $4b_2$) may tilt by the separating force. At this time, a force of shifting the relative positions of the mold 6 and a substrate 3 can act on them. Note that the separating force is an opposite force from a pressing force for separating the mold 6 from the cured imprint material 11 and is also referred to as a releasing force.

Figure 7A:
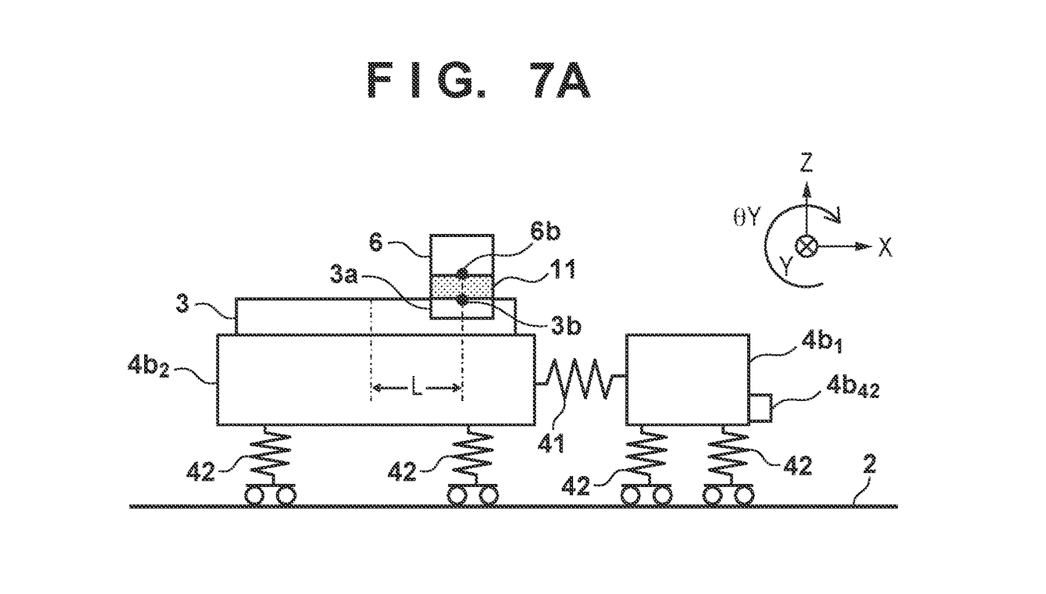
FIG. 7A is a conceptual view of a substrate stage for explaining the behavior of the substrate stage in a step of separating a mold from a cured imprint material.
Figure 7B:
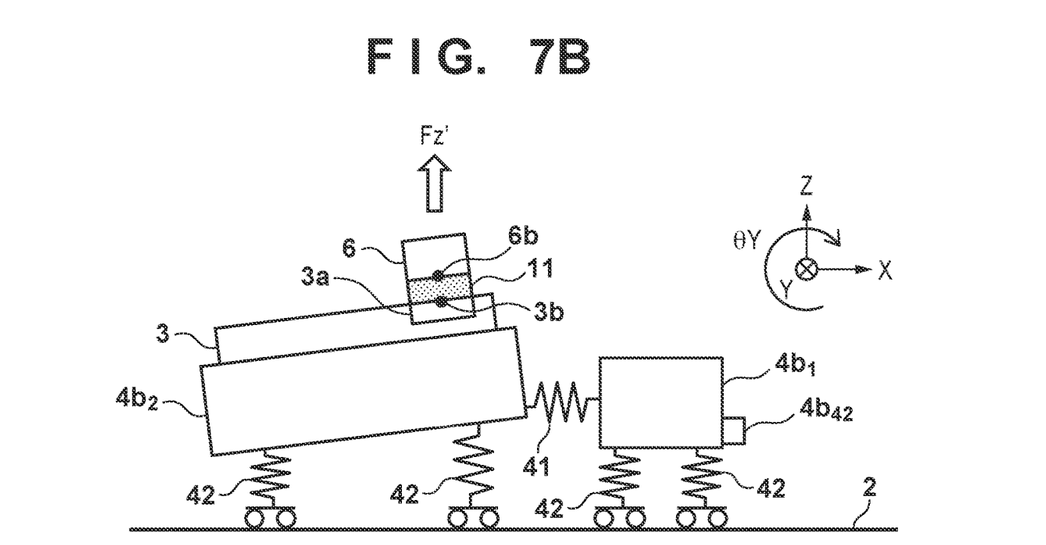
FIG. 7B is the conceptual view of the substrate stage for explaining the behavior of the substrate stage in the step of separating the mold from the cured imprint material.

Each of FIGS. 7A and 7B is a conceptual view of the substrate stage 4 for explaining the behavior of the substrate stage 4 in the step of separating the mold 6 from the cured imprint material 11. FIG. 7A shows a state immediately after the imprint material 11 is cured. FIG. 7B shows a state immediately before a separating force Fz' acts to start separating the mold 6 from the cured imprint material 11. Since the imprint material 11 is cured in FIG. 7B, a mark 3b of a target shot region 3a and a mark 6b of the mold 6 shift in an X direction much less than in FIG. 4B even if the substrate stage 4 (Y stage $4b_2$) tilts by the separating force Fz'. However, a static pressure guide 41 is being compressed because of a shearing force that acts on the imprint material 11, and a force of shifting the relative positions of the mold 6 and the substrate 3 may act on them. If the relative positions of the mold 6 and the substrate 3 shift as a result of this, the pattern of the mold 6 and a pattern formed in the imprint material 11 may be damaged.

To prevent this, the imprint apparatus according to the second embodiment controls the relative positions of the mold 6 and the target shot region 3a (substrate 3) so as to reduce the shift in the relative positions (X and Y directions) of them when separating the mold 6 from the cured imprint material 11. The relative positions of the mold 6 and the target shot region 3a can be controlled based on the separating force Fz' and a distance L from the reference position of the substrate 3 to the target shot region 3a.

In the second embodiment, a control unit 10 also corrects, by a corrector 10c, the relative positional shift caused by tilting the substrate stage 4 in step S106 as in step S103. At this time, the corrector 10c may obtain a correction value based on information indicating the relationship of the shift in the relative positions (horizontal direction) with respect to the pressing force Fz' and the distance L instead of information indicating the relationship of the shift in the relative positions (horizontal direction) with respect to a pressing force Fz and the distance L. Alternatively, the correction value that has been obtained based on the information indicating the relationship of the shift in the relative positions with respect to the pressing force Fz and the distance L may be changed by, for example, multiplying a coefficient according to the difference between the pressing force Fz and the separating force Fz' with it. The separating force Fz' can be obtained by, for example, multiplying a signal value to be supplied to the mold driving unit 7b by a constant (thrust constant) indicating a force generated by the mold driving unit 7b when supplying the signal value of a unit quantity. Also, a sensor (for example, a force sensor, a load cell, or a strain gauge) which detects the force generated by the mold driving unit 7b may be provided to obtain the separating force Fz' based on a result of a detection by the sensor.

As described above, the imprint apparatus according to the second embodiment controls the relative positions of the mold 6 and the target shot region 3a based on the separating force Fz' and the distance L in the step of separating the mold 6 from the cured imprint material 11. This makes it possible to reduce the shearing force generated when separating the mold 6 from the cured imprint material 11. That is, it is possible to reduce the shift in the relative positions of the mold 6 and the target shot region 3a caused by tilting the substrate stage 4 when separating the mold 6 from the cured imprint material 11.

<Embodiment of Method of Manufacturing Article>

A method of manufacturing an article according to an embodiment of the present invention is suitable for manufacturing the article, for example, a microdevice such as a semiconductor device or an element having a microstructure. The method of manufacturing the article according to this embodiment includes a step of forming a pattern in an imprint material supplied to a substrate using the above-described imprint apparatus (a step of performing an imprint process on the substrate) and a step of processing the substrate, on which the pattern has been formed, in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, quality, productivity, and production cost of the article, as compared to a conventional method.

Other Embodiments

Embodiment(s) of the present invention (the control unit) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-025619 filed on Feb. 12, 2015, and Japanese Patent Application No. 2015-183245 filed on Sep. 16, 2015, which are hereby incorporated by reference herein in their entirety.

What is claimed is:

1. An imprint apparatus which forms a pattern of an imprint material on a shot region of a substrate by using a mold, the apparatus comprising:
   a first stage configured to be movable in a first direction;
   a second stage configured to hold the substrate, and be supported by the first stage;
   a detector configured to detect a position of the first stage in the first direction; and
   a controller configured to control a process of bringing the mold and the imprint material on the shot region into contact with each other,
   wherein the controller is configured to:
      determine a shift in a relative position between the first stage and the second stage in the first direction, based on a pressing force of pressing the mold and the imprint material against each other, and a position of the shot region on the substrate, the shift being caused by a tilt of the second stage to the first stage during the process; and
      control the position of the first stage in the first direction during the process, based on a value obtained by correcting a detection result of the detector by the determined shift.

2. The apparatus according to claim 1, wherein the first direction is a direction intersecting a direction of the pressing force of pressing the mold and the imprint material against each other.

3. The apparatus according to claim 1, wherein the controller is configured to determine the shift, based on a formula or a table indicating a relationship of a shift in the relative position with respect to the pressing force and the position of the shot region on the substrate.

4. The apparatus according to claim 3, wherein the controller is configured to obtain the value by correcting a deviation between a position of the first stage detected by the detector and a target position by the determined shift, and control the position of the first stage in the first direction during the process based on the obtained value.

5. The apparatus according to claim 1, wherein the second stage is configured to be movable along the first stage in a second direction different from the first direction.

6. The apparatus according to claim 1, wherein the position of the shot region on the substrate includes a distance from a reference position of the substrate to the shot region.

7. The apparatus according to claim 6, wherein the reference position is a center of the substrate.

8. The apparatus according to claim 1, further comprising a driving unit configured to drive at least one of the mold and the substrate so as to bring the mold and the imprint material into contact with each other,
wherein the control unit obtains the pressing force from a signal value to be supplied to the driving unit.

9. The apparatus according to claim 1, further comprising a sensor configured to detect the pressing force.

10. The apparatus according to claim 1, wherein the controller is configured to:
    determine a second shift in the relative position in the first direction, the second shift being caused by a tilt of the second stage to the first stage during separating the mold from the cured imprint material on the shot region, based on a separating force of separating the mold from the cured imprint material, and the position of the shot region on the substrate; and
    control the position of the first stage in the first direction during separating the mold, based on a value obtained by correcting a detection result of the detector by the determined second shift.

11. An imprint apparatus which forms a pattern of an imprint material on a shot region of a substrate by using a mold, the apparatus comprising:
    a first stage configured to be movable in a first direction;
    a second stage configured to hold the substrate, and be supported by the first stage;
    a detector configured to detect a position of the first stage in the first direction; and
    a controller configured to control a second process of separating the mold from the cured imprint material on the shot region,
    wherein the controller is configured to:
       determine a second shift in a relative position between the first stage and the second stage in the first direction, the second shift being caused by a tilt of the second stage to the first stage during the second process based on a separating force of separating the mold from the cured imprint material, and a position of the shot region on the substrate; and
       control the position of the first stage in the first direction during the second process, based on a value obtained by correcting a detection result of the detector by the determined second shift.

12. The apparatus according to claim 1, wherein the controller is configured to, while sequentially determining the shift in accordance with a change of the pressing force, control the position of the first stage so as to correct the determined shift.

13. The apparatus according to claim 6, wherein the reference position is a position of the substrate where a tilt of the second stage becomes smallest when contacting the mold.

14. The apparatus according to claim 1, wherein the controller is configured to further control an alignment between the mold and the substrate, after the process of bringing the mold and the imprint material into contact with each other.

15. The apparatus according to claim 14, further comprising a measurement device configured to measure a positional relationship between the mold and the substrate,
    wherein the controller is configured to control the alignment based on the positional relationship measured by the measurement device.

16. The apparatus according to claim 1, wherein
    the first stage is configured to be elongated in a second direction different form the first direction,
    the second stage is configured to be movable along the first stage in the second direction.

* * * * *